(12) United States Patent
Kubik et al.

(10) Patent No.: US 12,326,483 B2
(45) Date of Patent: Jun. 10, 2025

(54) MAGNETIC MULTI-TURN SENSOR STRUCTURES AND FABRICATION

(71) Applicant: Analog Devices International Unlimited Company, Limerick (IE)

(72) Inventors: Jan Kubik, Limerick (IE); Jochen Schmitt, Biedenkopf (DE); Onur Necdet Urs, Hamburg (DE)

(73) Assignee: Analog Devices International Unlimited Company, Limerick (IE)

( * ) Notice: Subject to any disclaimer, the term of this patent is extended or adjusted under 35 U.S.C. 154(b) by 259 days.

(21) Appl. No.: 18/157,282

(22) Filed: Jan. 20, 2023

(65) Prior Publication Data
US 2023/0243897 A1  Aug. 3, 2023

Related U.S. Application Data

(60) Provisional application No. 63/304,279, filed on Jan. 28, 2022.

(51) Int. Cl.
*G01R 33/00* (2006.01)
*G01R 33/09* (2006.01)

(52) U.S. Cl.
CPC ....... *G01R 33/0052* (2013.01); *G01R 33/093* (2013.01); *G01R 33/098* (2013.01)

(58) Field of Classification Search
CPC .. B64G 1/366; G01R 33/0206; G01R 33/028; G01R 33/038; G01R 33/1215
See application file for complete search history.

(56) References Cited

U.S. PATENT DOCUMENTS

| | | | |
|---|---|---|---|
| 2018/0216965 A1* | 8/2018 | Richard | G01D 5/145 |
| 2022/0075010 A1 | 3/2022 | Meehan et al. | |

FOREIGN PATENT DOCUMENTS

CN    109507617 B  *  2/2020  ......... G01R 33/0206

* cited by examiner

*Primary Examiner* — Tung X Nguyen
(74) *Attorney, Agent, or Firm* — Schwegman Lundberg & Woessner, P.A.

(57) ABSTRACT

The techniques described are applicable to closed-loop magnetic multi-turn sensors including giant magnetoresistance (GMR-MT) sensors as well as tunnel magnetoresistive (TMR) multi-turn sensors. Techniques, e.g., lithography techniques, are described to form crossings so that a distortion of an ideal shape is reduced or minimized. Another aspect describes techniques to modify the material thickness and/or magnetic properties in such an area of the crossing. Yet another aspect describes techniques to locally weaken the applied field in the area of the crossing to prevent nucleation events in this area. The techniques described are applicable to closed-loop magnetic multi-turn sensors including giant magnetoresistance (GMR-MT) sensors as well as tunnel magnetoresistive (TMR) multi-turn sensors.

20 Claims, 11 Drawing Sheets

MAGNETIC MULTI-TURN SENSOR STRUCTURES AND FABRICATION

CLAIM OF PRIORITY

This application claims the benefit of priority of U.S. Provisional Patent Application Ser. No. 63/304,279, titled "GMR-MT SENSOR LOOP CROSSING STRUCTURES AND FABRICATION" to Jan Kubik et al., filed on Jan. 28, 2022, the entire contents of which being incorporated herein by reference.

FIELD OF THE DISCLOSURE

This document pertains generally, but not by way of limitation, to magnetic sensing, and more particularly, to integrated circuit structures comprising at least a portion of a multi-turn giant magnetoresistance (GMR-MT) sensor device along with related fabrication techniques.

BACKGROUND

An integrated circuit can include a magnetic sensing device. Such a device can include multiple loop structures to provide a "multi-turn" (MT) sensor. Such a sensor can be used for sensing an angular position or angular rate associated with motion (e.g., rotation) of a structure. As an illustrative example, an MT sensor can be used as an angular position sensor in a vehicular application, such as for detecting a position of a steering wheel.

An MT sensor device can include a magnetoresistive structure that is sensitive to an applied external magnetic field. The resistance of the magnetoresistive element can be changed by varying a magnetic field nearby the sensor. Variation in the resistance of the magnetoresistive element can be tracked to determine variation in angular position of another structure. An MT sensor includes multiple magnetoresistive elements in an open loop or closed loop structure that is laid out as a strip with one end of the strip being coupled to a domain wall generator. The domain wall generator generates domain walls in response to rotations of an external magnetic field, these domain walls then being injected into the magnetic strip. Domain walls propagate around the loop structure in response to variation in an applied external magnetic field, causing a corresponding change in resistance.

In a magnetic sensing device employing a giant magnetoresistance (GMR) effect, crossings are included for GMR closed loop sensor topologies to guide magnetic domain walls from the inside to the outside of turns of a spiral-shaped or concentrically-looped structure. Ideally, during operation, domain walls travel only straight through the crossing and the crossing does not form a domain wall nucleation point in the sensor. Such operation can be compromised if the crossing is formed in less than an ideal way, such as having rounded corners.

SUMMARY OF THE DISCLOSURE

This disclosure describes techniques, e.g., lithography techniques, to form crossings so that a distortion of an ideal shape is reduced or minimized. Another aspect of the disclosure describes techniques to modify the material thickness and/or magnetic properties in such an area of the crossing. Yet another aspect of the disclosure describes techniques to locally weaken the applied field in the area of the crossing to prevent nucleation events in this area. The techniques of this disclosure are applicable to closed-loop magnetic multi-turn sensors including giant magnetoresistance (GMR-MT) sensors as well as tunnel magnetoresistive (TMR) multi-turn sensors.

In some aspects, this disclosure is directed to a method of manufacturing a closed-loop magnetic multi-turn sensor, the method comprising: forming a substrate; forming, over the substrate, a magnetic film layer; forming, over a first photoresist material layer applied to the magnetic film layer, a first mask layer having a first pattern; exposing the first photoresist material layer; forming, over a second photoresist material layer and over the first mask layer, a second mask layer having a second pattern; aligning the second mask layer with the first mask layer such that the first pattern and the second pattern together form a cross shape of the magnetic film layer; and exposing the second photoresist material layer.

In some aspects, this disclosure is directed to a closed-loop magnetic multi-turn sensor, the multi-turn sensor comprising: a substrate; a magnetic film layer formed over the substrate; and a cross shape of the magnetic film layer formed by aligning a first pattern and a second pattern.

In some aspects, this disclosure is directed to a method of manufacturing a closed-loop magnetic multi-turn sensor, the method comprising: forming a substrate; forming, over the substrate, a magnetic film layer; forming a cross shape of the magnetic film layer; and forming a material over a portion of the cross shape of the magnetic film layer to magnetically shield the portion.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present subject matter includes various techniques to form crossings to reduce or suppress distortion of the cross structure as fabricated. The present inventors have also recognized that material thickness or magnetic properties (or both) can be modified in the area of the crossing, such as in combination with various fabrication techniques. Yet another aspect of the present subject can include localized weakening of the applied field in the area of the crossing to suppress or inhibit nucleation events.

Figure 1:
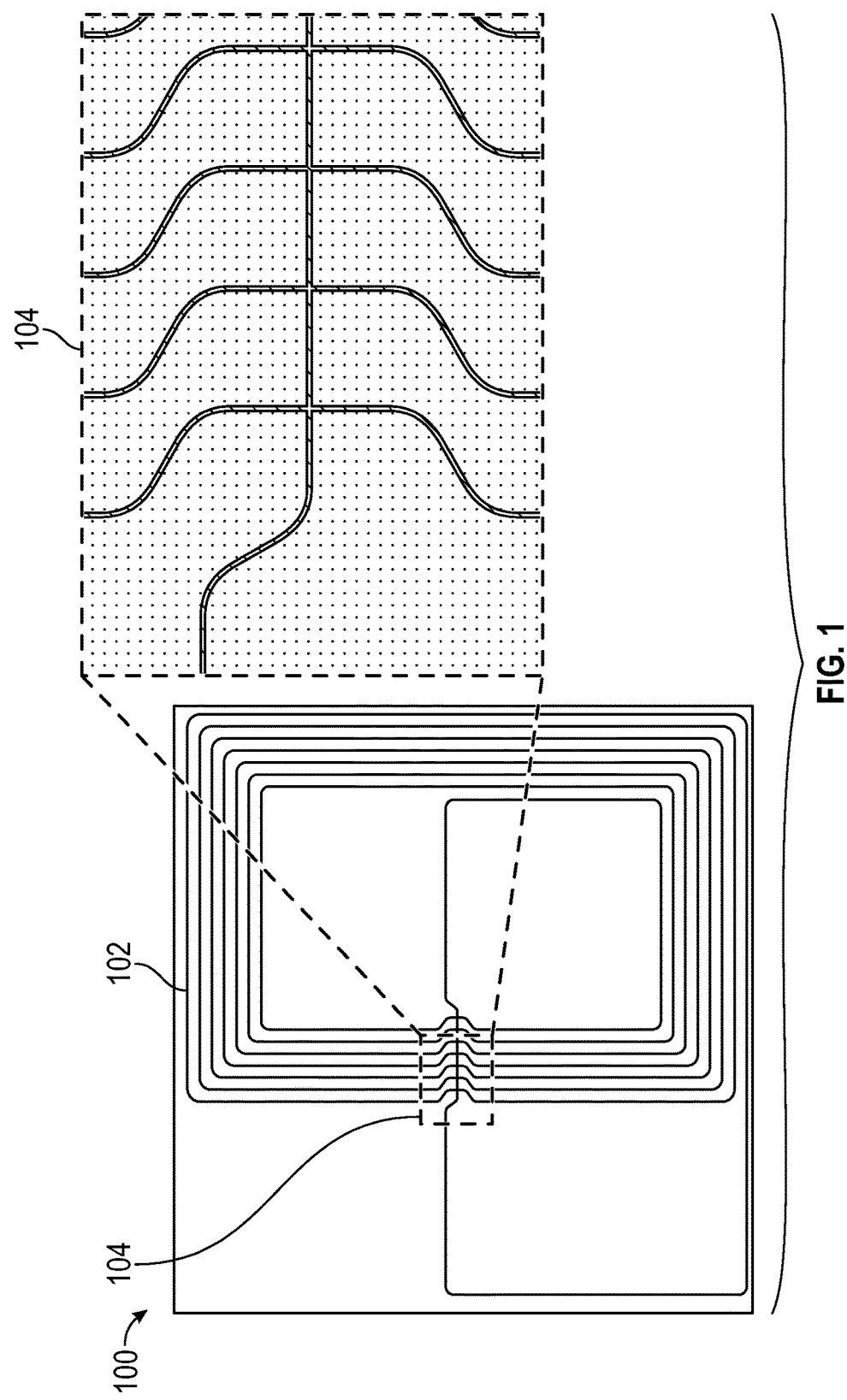
FIG. 1 is an example of a layout of a magnetic multi-turn sensor.

FIG. 1 is an example of a layout of a magnetic multi-turn sensor 100. The magnetic multi-turn sensor 100 is a closed-loop structure that includes a plurality of turns 102. The magnetic multi-turn sensor 100 is spiral-shaped and includes a plurality of resistor crossings (also referred to in this disclosure as simply "crossings"), some of which being shown in the crossing area 104. The crossing area 104 is enlarged and shown on the right of FIG. 1.

Figure 2:
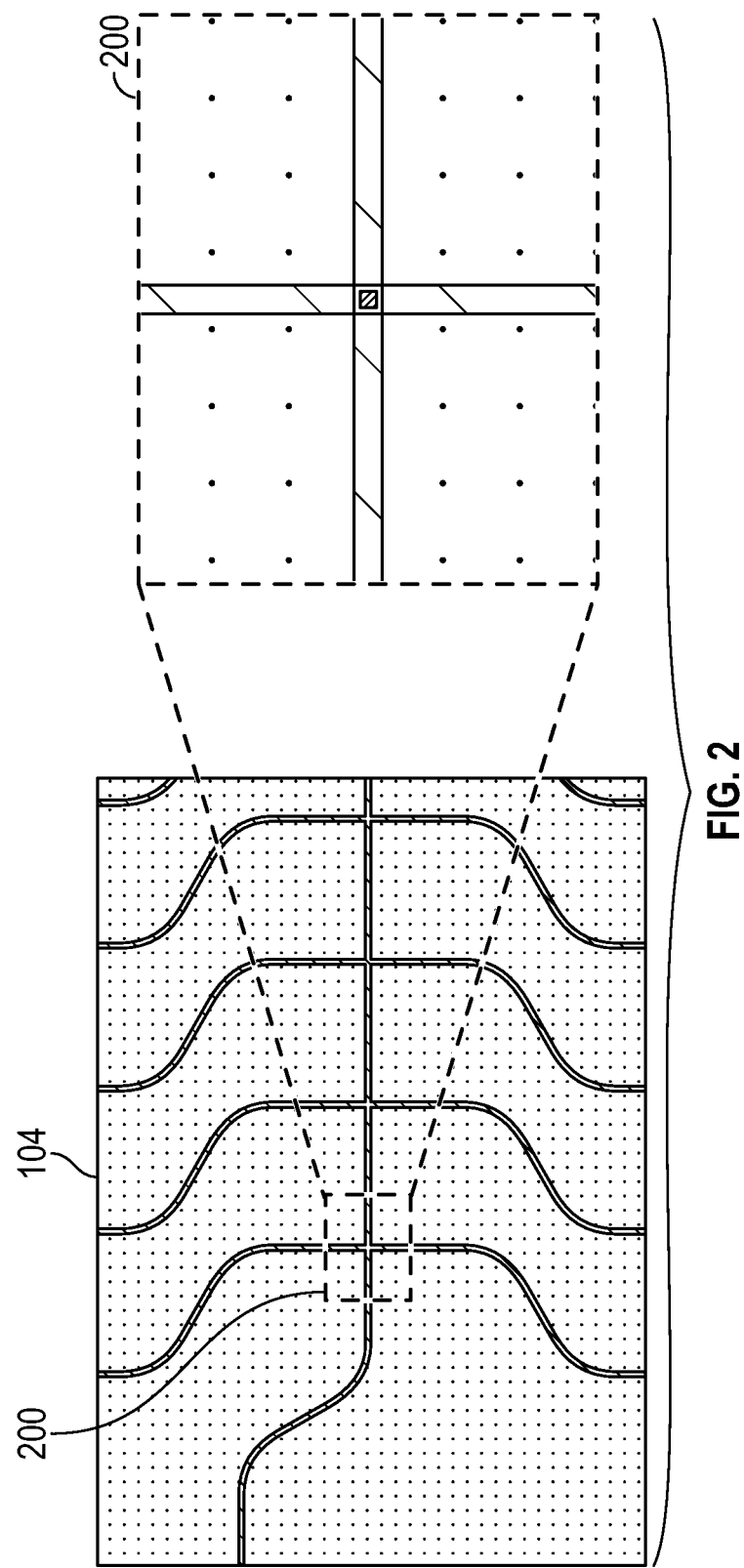
FIG. 2 depicts the crossing area of the magnetic multi-turn sensor of FIG. 1.

FIG. 2 depicts the crossing area 104 of the magnetic multi-turn sensor 100 of FIG. 1. A crossing 200 of the crossing area 104 is enlarged and shown on the right of FIG. 2.

Figure 3:
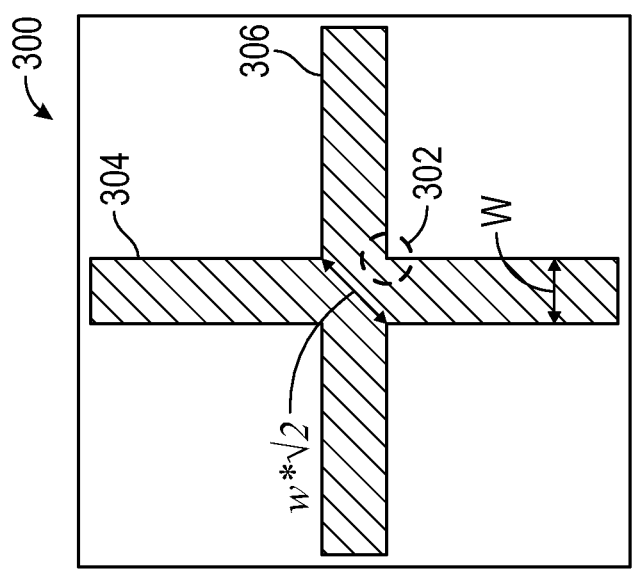
FIG. 3 depicts a crossing that is an example of the crossing of FIG. 2 when isolated from the rest of the magnetic multi-turn sensor of FIG. 1.

FIG. 3 depicts a crossing 300 that is an example of the crossing 200 of FIG. 2 when isolated from the rest of the magnetic multi-turn sensor 100 of FIG. 1. The crossing 300 is an idealized crossing that has sharp corners 302 where a linear portion 304 of a magnetic film intersects with a linear portion 306 of the magnetic film. A maximum magnetic field (Bmax) at which the crossing is functional and not nucleating unwanted domain walls is reduced by a factor of the line width (w) multiplied by the square root of 2 (w*√2) compared to straight line with line width w.

Figure 4:
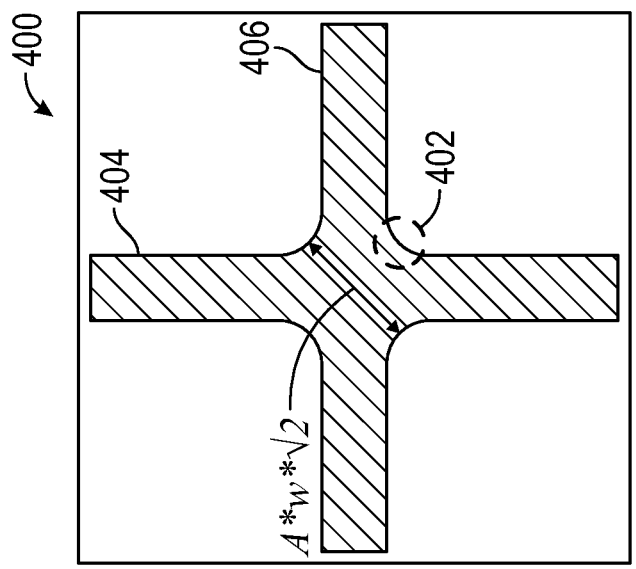
FIG. 4 depicts a crossing that is an example of the crossing of FIG. 2 when isolated from the rest of the magnetic multi-turn sensor of FIG. 1 and when formed with rounded corners.

FIG. 4 depicts a crossing 400 that is an example of the crossing 200 of FIG. 2 when isolated from the rest of the magnetic multi-turn sensor 100 of FIG. 1 and when formed with rounded corners. The crossing 400 is a non-ideal crossing that has rounded corners 402 where a linear portion 404 of a magnetic film intersects with a linear portion 406 of the magnetic film. This distortion is caused by single-step lithography process limitations. The maximum magnetic field (Bmax) at the crossing will be lower than that of the idealized crossing of FIG. 3. The maximum magnetic field (Bmax) at which the crossing is functional will be lower by a factor A compared to the ideal case of FIG. 3 (A*w*√2).

Crossings are used by a closed loop sensor, such as the magnetic multi-turn sensor 100 of FIG. 1, to guide magnetic domain walls from the inside to the outside of turns of the spiral. The function of the crossing should be that domain walls travel straight though it and that it does not form a weak spot (or nucleation point) in the sensor. Both functions are compromised if the crossing is formed in a less-than-ideal way, such as with rounded corners, such as shown in FIG. 4.

This disclosure describes techniques, e.g., lithography techniques, to form such crossings so that the distortion of an ideal shape is reduced or minimized. Another aspect of the disclosure describes techniques to modify the material thickness and/or magnetic properties in such an area of the crossing. Yet another aspect of the disclosure describes techniques to locally weaken the applied field in the area of the crossing to prevent nucleation events in this area. The techniques of this disclosure are applicable to closed-loop magnetic multi-turn sensors including giant magnetoresistance (GMR-MT) sensors as well as tunnel magnetoresistive (TMR) multi-turn sensors.

Figure 5C:
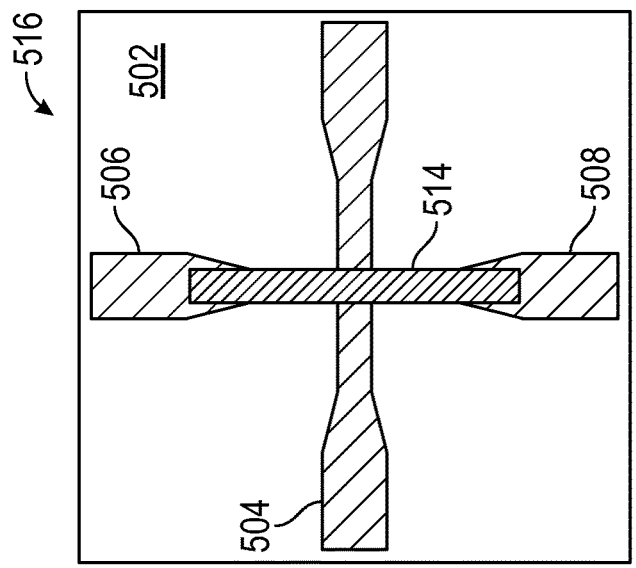
FIGS. 5A-5C depict an example of forming a closed-loop magnetic multi-turn sensor crossing, in accordance with this disclosure.
Figure 5B:
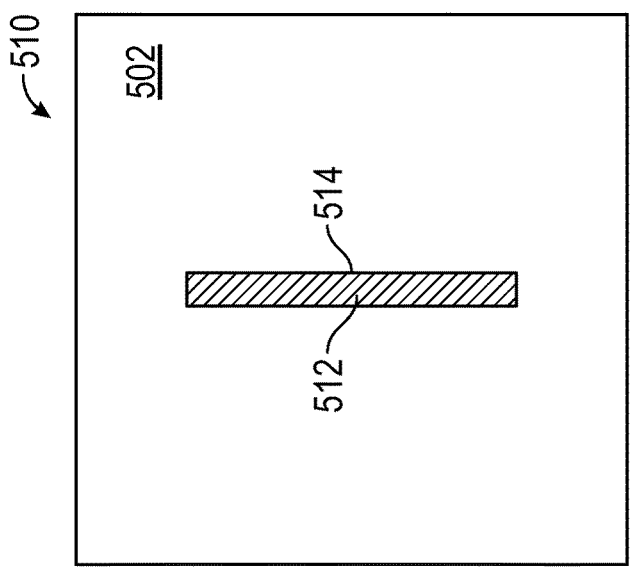
Figure 5A:
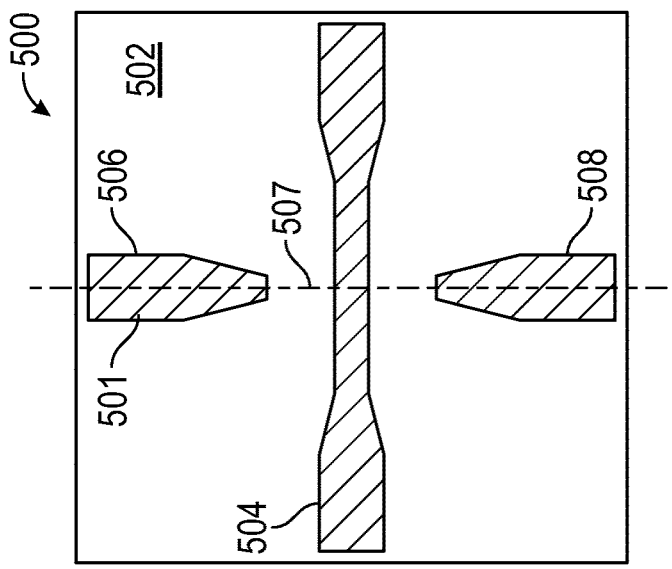

FIGS. 5A-5C depict an example of forming a closed-loop magnetic multi-turn sensor crossing, in accordance with this disclosure. A substrate, e.g., a wafer, can be formed, and over the substrate, a magnetic film layer can be formed.

FIG. 5A depicts a first mask layer 500 having a first pattern that can be formed over a first photoresist material layer 501 applied to a magnetic film layer 502 formed on a substrate. The pattern of the first mask layer 500 includes a first linear mask portion 504 and a second linear mask portion 506, where the second linear mask portion 506 is perpendicular to the first linear mask portion 504.

The pattern of the first mask layer 500 further includes a third linear mask portion 508, where the third linear mask portion 508 is perpendicular to the first linear mask portion 504. In addition, the third linear mask portion 508 is linearly aligned with the second linear mask portion 506 as indicated by dashed line 507. Neither the second linear mask portion 506 nor the third linear mask portion 508 intersect with the first linear mask portion 504. The first photoresist material layer 501 can then be exposed.

The pattern of the first mask layer 500 can be formed using i-line or deep ultraviolet (DUV) lithography techniques, for example.

FIG. 5B depicts a second mask layer 510 having a second pattern that can be formed over a second photoresist material layer 512 and over the first mask layer 500. The second photoresist material layer 512 of FIG. 5B and the first photoresist material layer 501 of FIG. 5A are the same photoresist material layer. The pattern of the second mask layer 510 includes a fourth linear mask portion 514.

FIG. 5C depicts the second mask layer 510 of FIG. 5B aligned with the first mask layer 500 of FIG. 5A. When the second pattern of FIG. 5B is aligned with the first pattern of FIG. 5A, the first pattern and the second pattern together form a cross shape 516 of the magnetic film layer 502, as seen in FIG. 5C. When aligned, the fourth linear mask portion 514 couples the second linear mask 506 portion to the third linear mask portion 508. In addition, the fourth linear mask portion 514 intersects the first linear mask portion 504. Neither the first pattern of FIG. 5A nor the second pattern of FIG. 5B alone form a cross shape; together they form a cross shape, as shown in FIG. 5C.

The techniques of FIGS. 5A-5C can be performed using two masks to expose the same photoresist material layer in two expose and one develop and etch steps. A first step can involve exposing a first mask layer 500 to print the horizontal first linear mask portion 504 and the unconnected vertical second linear mask portion 506 and third linear mask portion 508 in FIG. 5A. Again, there is no crossing of the horizontal and vertical portions. In a second step, without developing the photoresist material layer of FIG. 5A and without etching, a second mask layer 510 having a different pattern than the first mask layer can be exposed. Developing and etching can then be performed.

By using the techniques of FIGS. 5A-5C, the cross shape of FIG. 5C can be printed without the interference that normally occurs in the corners, which results in the rounding shown in FIG. 4. The reason that there is rounding is because light interference occurs in the corners, which results in partial exposure.

Figure 6C:
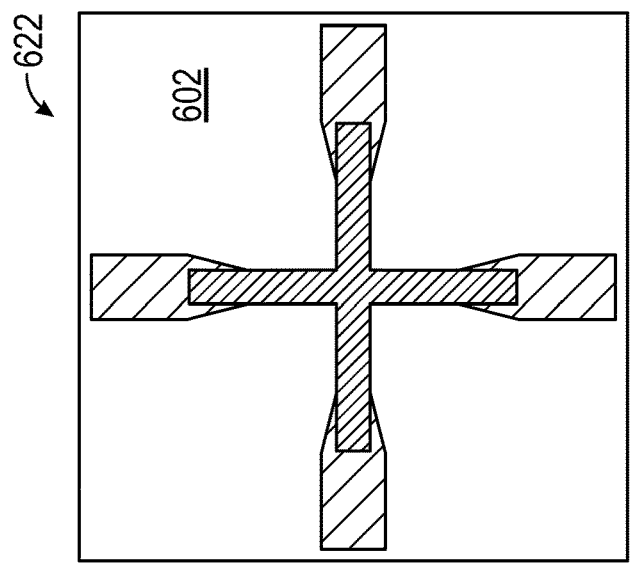
FIGS. 6A-6C depict another example of forming a closed-loop magnetic multi-turn sensor crossing, in accordance with this disclosure.
Figure 6B:
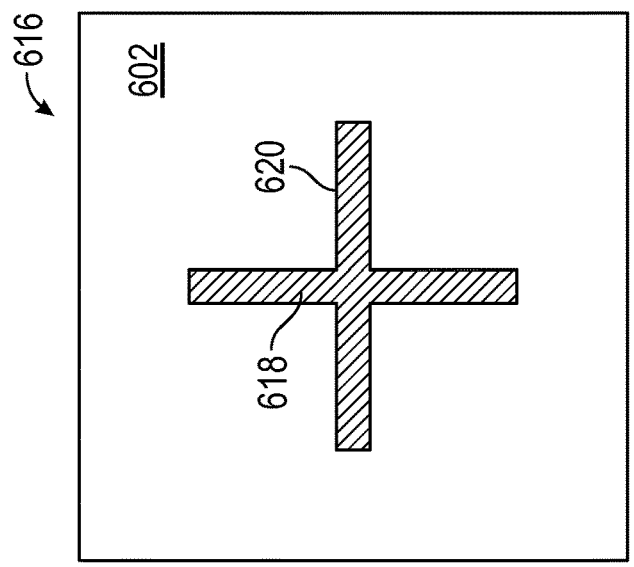
Figure 6A:
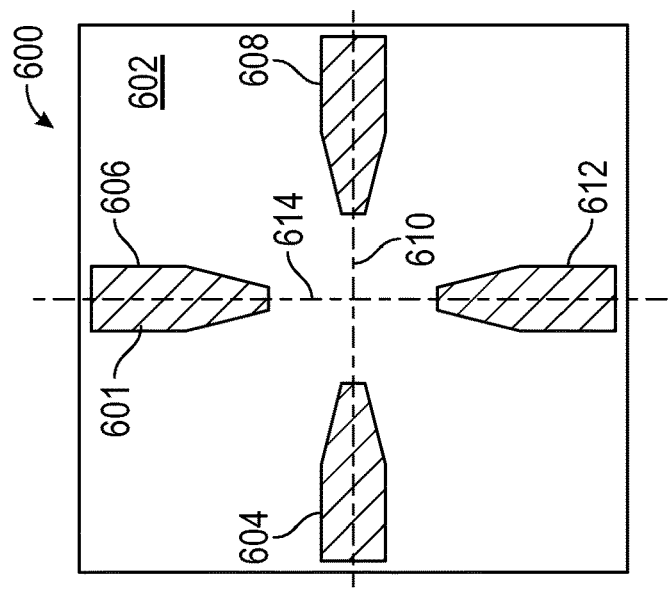

FIGS. 6A-6C depict another example of forming a closed-loop magnetic multi-turn sensor crossing, in accordance with this disclosure. A substrate, e.g., a wafer, can be formed, and over the substrate, a magnetic film layer can be formed.

FIG. 6A depicts a first mask layer 600 having a first pattern that can be formed over a first photoresist material layer 601 applied to a magnetic film layer 602 formed on a substrate. The pattern of the first mask layer 600 includes a first linear mask portion 604 and a second linear mask portion 606, where the second linear mask portion 606 is perpendicular to the first linear mask portion 604. The pattern of the first mask layer 600 further includes a third linear mask portion 608, where the third linear mask portion 608 is perpendicular to the second linear mask portion 606, and where the third linear mask portion 608 is linearly aligned with the first linear mask portion 604 as indicated by dashed line 610.

The pattern of the first mask layer 600 further includes a fourth linear mask portion 612, where the fourth linear mask portion 612 is perpendicular to the third linear mask portion 608, and where the fourth linear mask portion is linearly aligned with the second linear mask portion 606 as indicated by dashed line 614. None of the first linear mask portion 604, the second linear mask portion 606, the third linear mask portion 608, and the fourth linear mask portion 612 intersect with one another.

The pattern of the first mask layer 600 can be formed using i-line or deep ultraviolet lithography techniques, for example.

FIG. 6B depicts a second mask layer 616 having a second pattern that can be formed over a second photoresist material layer 618 and over the first mask layer 600. The second photoresist material layer 618 of FIG. 6B and the first photoresist material layer 601 of FIG. 6A are the same photoresist material layer. The pattern of the second mask layer 616 includes a cross-shaped portion 620. The cross-shaped portion 620 can formed using electron beam (e-beam) lithography techniques. The e-beam lithography techniques can be used to print the sharp corners of the second pattern of the second mask layer 616. E-beam lithography is accurate, but slow. Although it may not be practical to print the entire structure using e-beam lithography, a portion can be printed using such techniques.

FIG. 6C depicts the second mask layer 616 of FIG. 6B aligned with the first mask layer 600 of FIG. 6A. When the second pattern of FIG. 6B is aligned with the first pattern of FIG. 6A, the first pattern and the second pattern together form a cross shape 622 of the magnetic film layer 502, as seen in FIG. 6C. When aligned, the cross-shaped portion 620 couples the first linear mask portion 604 to the third linear mask portion 608 and the second linear mask portion 606 to the fourth linear mask portion 612.

The techniques of FIGS. 6A-6C can be performed using two masks to expose the same photoresist material layer in two expose and one develop and etch steps. A first step can involve exposing a first mask layer 600 to print the unconnected portions in FIG. 6A. In a second step, without developing the photoresist material layer of FIG. 6A and without etching, a second mask layer 616 having a different pattern than the first mask layer can be exposed. A universal photoresist material can be used, for example, which is sensitive to both i-line/DUV and e-beam techniques.

By using the techniques of FIGS. 6A-6C, the cross shape of FIG. 6C can be printed without the interference that normally occurs in the corners, which results in the rounding shown in FIG. 4.

Figure 7A:
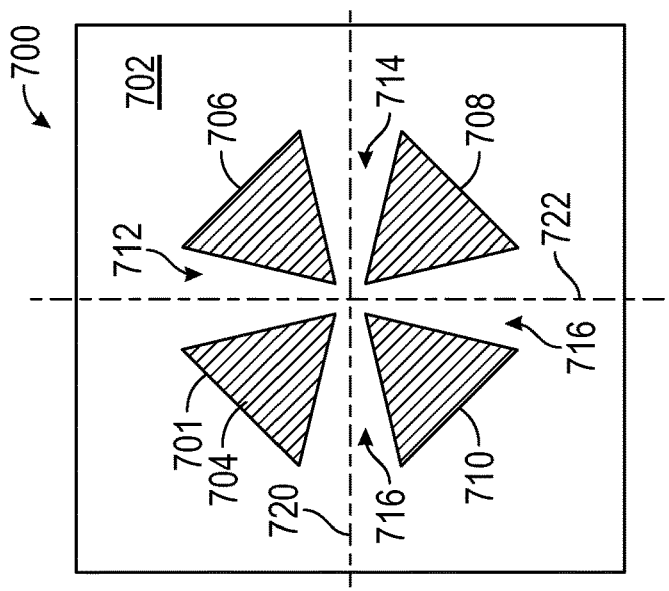
FIGS. 7A-7C depict another example of forming a closed-loop magnetic multi-turn sensor crossing, in accordance with this disclosure.
Figure 7B:
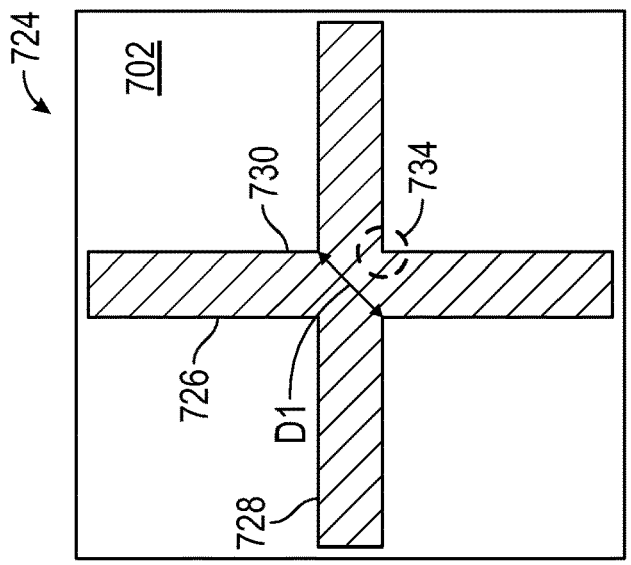
Figure 7C:
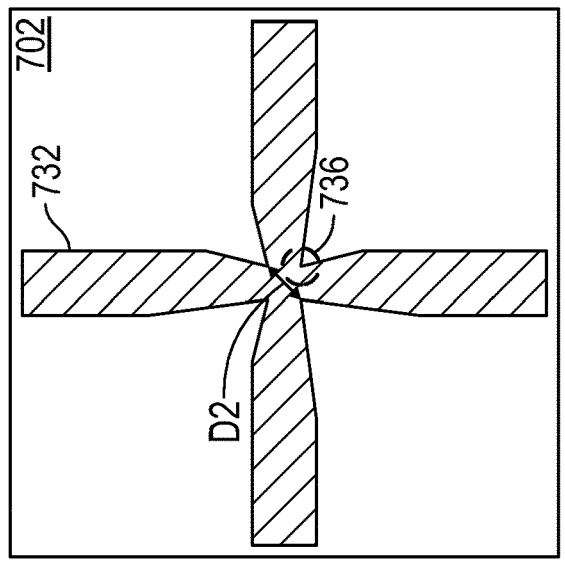

FIGS. 7A-7C depict another example of forming a closed-loop magnetic multi-turn sensor crossing, in accordance with this disclosure. A substrate, e.g., a wafer, can be formed, and over the substrate, a magnetic film layer can be formed.

FIG. 7A depicts a first mask layer 700 having a first pattern that can be formed over a first photoresist material layer 701 applied to a magnetic film layer 702 formed on a substrate. The pattern of the first mask layer 700 includes a first triangular mask portion 704 and a second triangular mask portion 706 that is offset from the first triangular mask portion 704. The pattern of the first mask layer 700 further includes a third triangular mask portion 708 that is offset from the second triangular mask portion 706 and the first triangular mask portion 704. The pattern of the first mask layer 700 further includes a fourth triangular mask portion 710 that is offset from the third triangular mask portion 708 and the second triangular mask portion 706 and the first triangular mask portion 704. The triangular portions in FIG. 7A are offset linearly and angularly.

As seen in FIG. 7A, spaces 712-718 between the triangular mask portions 704-710 define a first cross shape, as generally indicated by the dashed lines 720, 722. The first cross shape resembles a Maltese cross.

The pattern of the first mask layer 700 can before formed using e-beam lithography techniques, for example. The e-beam lithography techniques can be used to print the sharp corners of triangular portions of the first pattern in FIG. 7A.

FIG. 7B depicts a second mask layer 724 having a second pattern that can be formed over a second photoresist material layer 726 and over the first mask layer 700. The second photoresist material layer 726 of FIG. 7B and the first photoresist material layer 701 of FIG. 7A are different photoresist material layers. The pattern of the second mask layer 724 includes a second cross shape that is different from the first cross shape of FIG. 7A. In contrast to the spaces in FIG. 7A that form the first cross shape, the second cross shape of FIG. 7B is formed by intersecting linear portions 728, 730.

FIG. 7C depicts the second mask layer 724 of FIG. 7B aligned with the first mask layer 700 of FIG. 7A. When the second cross shape of FIG. 7B is aligned with the first cross shape of FIG. 7A, the first cross shape modifies the second cross shape to form a third cross shape 732 that is different from both the first cross shape and the second cross shape. For example, the sharp corner of the third triangular mask portion 708 of the first mask layer 700 modifies the region 734 of FIG. 7B to generate a region 736 having a dimension D2 that is less than a corresponding dimension D1 of FIG. 7B. The reduction in the dimension D2 can improve the maximum magnetic field (Bmax) at which the crossing is functional as required.

The techniques of FIGS. 7A-7C can be performed using two lithography steps to expose the two photoresist material layers using two exposing steps, two developing steps, and two etching steps. A first lithography step can include applying e-beam photoresist material, such as a negative tone photoresist, and then exposing the first mask layer 700 with an e-beam, followed by developing and etching. A second lithography step can include applying an i-line or DUV photoresist material, and then exposing the second mask layer 724 with an i-line or a DUV, followed by developing and etching.

By using the techniques of FIGS. 7A-7C, the cross shape of FIG. 7C can be printed without the interference that normally occurs in the corners, which results in the rounding shown in FIG. 4.

The present inventors have also recognized the desirability of adding a dopant material at the crossing areas, which can increase the free layer exchange stiffness and, as a result, increase the maximum magnetic field Bmax. Adding a dopant material can modify the magnetic properties of the material where it is exposed. For example, it can be desirable to change saturation magnetization of the material to make it saturate at a higher field and increase the field where it starts to nucleate. Although some of the magneto-resistance properties may be lost due to the doping, it is not an issue because resistance measurements are not taken in the crossing area; resistance measurements are taken in the straight areas outside of the crossing area.

Doping can be performed on any of the structures shown in FIGS. 5A-5C, 6A-6C, and 7A-7C. Doping can be performed either before or after patterning the crosses shown in FIGS. 5C, 6C, and 7C. In some examples, it can be desirable to selective dope the crosses shown in FIGS. 5C, 6C, and 7C.

Figure 8C:
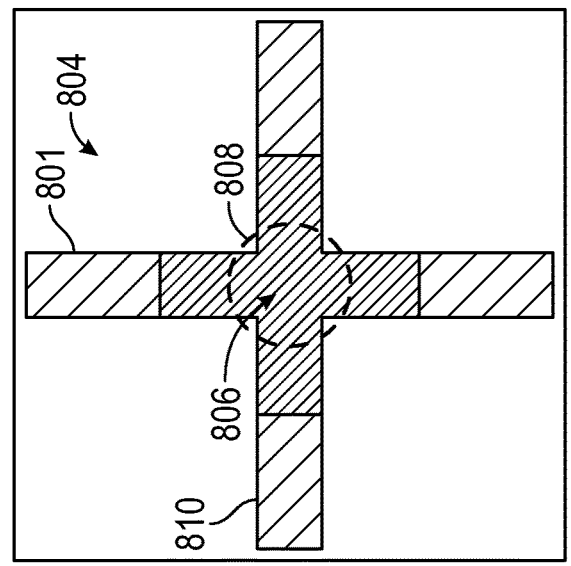
FIGS. 8A-8C depict an example of implanting a dopant material in a patterned cross shape of a magnetic film layer, in accordance with this disclosure.
Figure 8B:
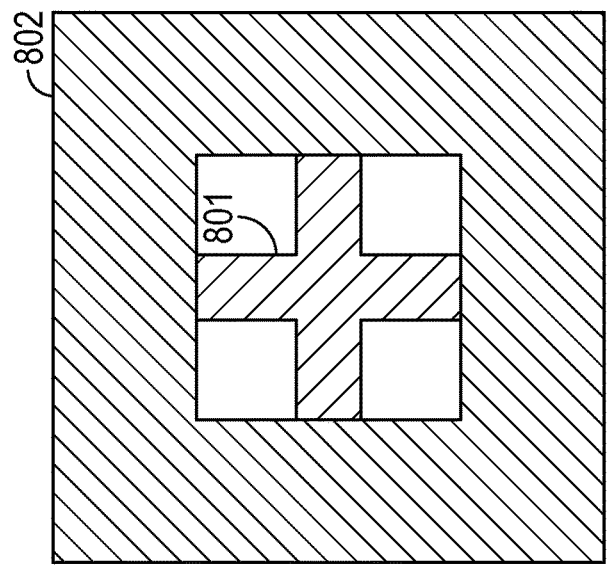
Figure 8A:
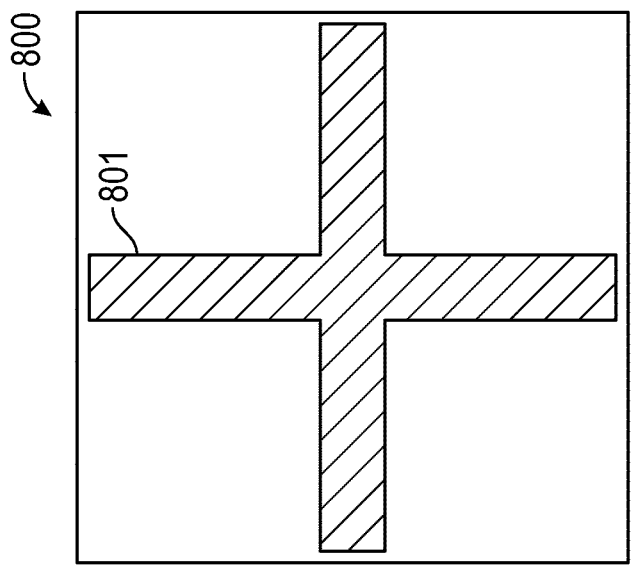

FIGS. 8A-8C depict an example of implanting a dopant material in a patterned cross shape of a magnetic film layer, in accordance with this disclosure. FIG. 8A depicts a patterned cross shape 800 of a magnetic film layer 801, which represents any of the patterned cross shapes formed using the techniques shown in FIGS. 5A-5C, 6A-6C, and 7A-7C. Doping can be performed either before or after patterning the crosses shown in FIGS. 5C, 6C, and 7C. In some examples, it can be desirable to selective dope the crosses shown in FIGS. 5C, 6C, and 7C.

FIG. 8B depicts a mask 802 with a doping barrier layer applied over a selective portion of the patterned cross shape 800 of the magnetic film layer 801. The mask 802 protects everything but the exposed portion of the patterned cross shape 800 of the magnetic film layer 801 from the dopant material. Non-limiting examples of dopant materials include Tb, Gd, Nb, V, Pt, La, Sm. The dopant material is implanted in a portion of the cross shape of the magnetic film layer not protected by the mask 802.

FIG. 8C depicts a doped patterned cross shape 804 including a doped area 806 in the crossing area 808 and undoped areas 810 outside of the crossing area 808.

The present inventors have also recognized the desirability of forming a material over a portion of the cross shape of the magnetic film layer to magnetically shield the portion. By shielding a portion of the cross shape, the observed maximum magnetic field at the crossing is weakened. The shielding techniques described below with respect to FIGS. 9A-9C can be performed on any of the structures shown in FIGS. 5A-5C, 6A-6C, and 7A-7C.

Figure 9A:
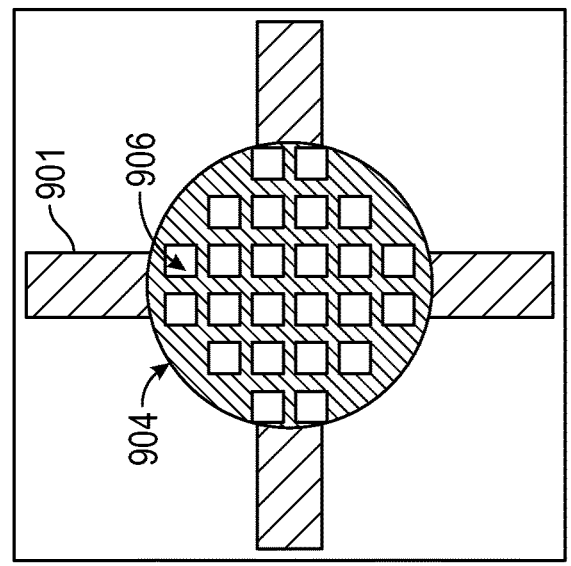
FIGS. 9A-9C depict an example of forming a material over a portion of the cross shape of the magnetic film layer to magnetically shield the portion, in accordance with this disclosure.
Figure 9B:
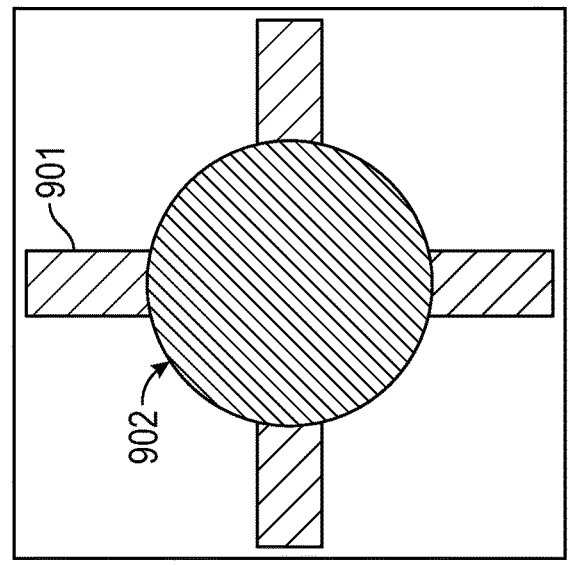
Figure 9C:
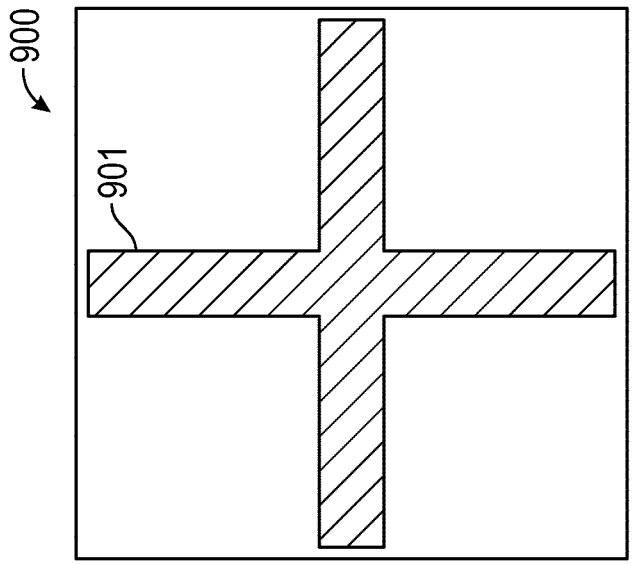

FIGS. 9A-9C depict an example of forming a material over a portion of the cross shape of the magnetic film layer to magnetically shield the portion, in accordance with this disclosure. FIG. 9A depicts a patterned cross shape 900 of a magnetic film layer 901, which represents any of the patterned cross shapes formed using the techniques shown in FIGS. 5A-5C, 6A-6C, and 7A-7C.

FIG. 9B depicts a shielding material 902 formed over the magnetic film layer 901 to magnetically shield the portion of the magnetic film layer 901 under the shielding material 902. The magnetic film layer 901 can attenuate the magnetic field around the crossing, such as by 10-40%. In some examples, there is an intervening material between the shielding material 902 and the magnetic film layer 901. In some examples, the shielding material 902 can include electroplated nickel iron (NiFe), e.g., 1-5 micrometers thick, separated from the magnetic film layer 901 by a non-magnetic, insulating layer, e.g., about 0.5 micrometers thick.

Although shown in a circular shape, the shielding material 902 is not limited to circular shapes and can include a square or other shapes. In addition, although the shielding material 902 is shown as a solid shape in FIG. 9B, in other examples, such as shown in FIG. 9C, the shielding material 902 can be patterns, such as including holes. The holes can make it difficult for the external magnetic field to saturate the shielding, which would cause it to lose its attenuation.

FIG. 9C depicts a shielding material 904 formed over the magnetic film layer 901 to magnetically shield the portion of the magnetic film layer 901 under the shielding material 904. As seen in FIG. 9C, the shielding material 904 is patterned. In the example shown, the shielding material 904 is patterned with a plurality of holes 906. Although depicted as squares, the holes can be circular or some other shape, such as hexagons or even generally linear.

Like in FIG. 9B, in some examples, there is an intervening material between the shielding material 904 and the magnetic film layer 901. The shielding material 904 can include electroplated nickel iron (NiFe), e.g., 1-5 micrometers thick, separated from the magnetic film layer 901 by a non-magnetic, insulating layer, e.g., about 0.5 micrometers thick.

In other examples, the pattern in FIG. 9C can be inverted such that there are small squares, circles, or some other shape of shielding material 904 covering the magnetic film layer 901.

Figure 10C:
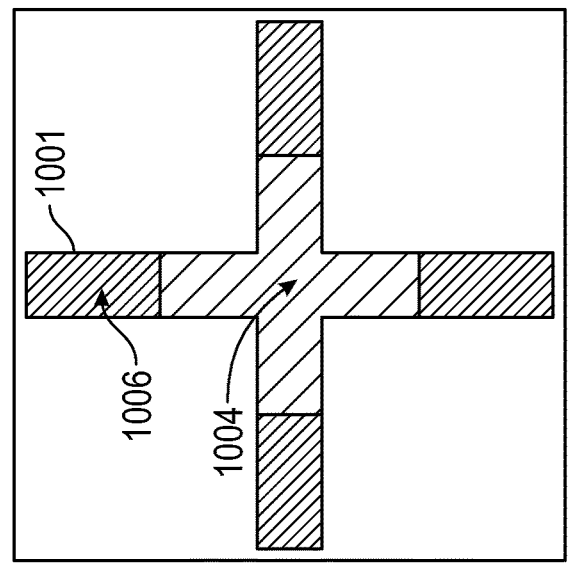
FIGS. 10A-10C depict an example of increasing a free layer thickness to locally increase the maximum magnetic field, in accordance with this disclosure.
Figure 10B:
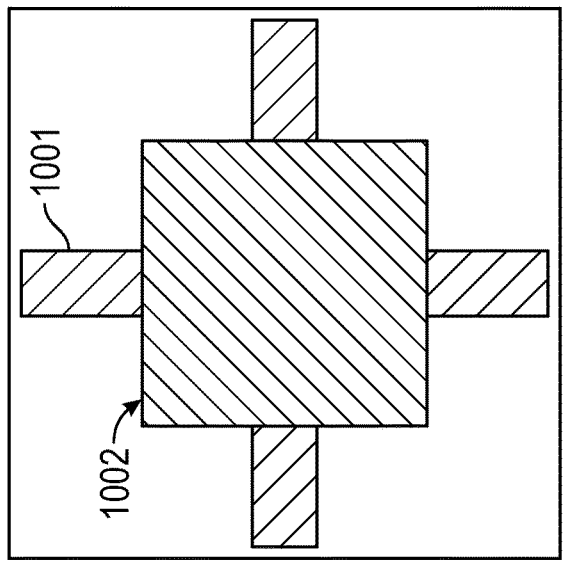
Figure 10A:
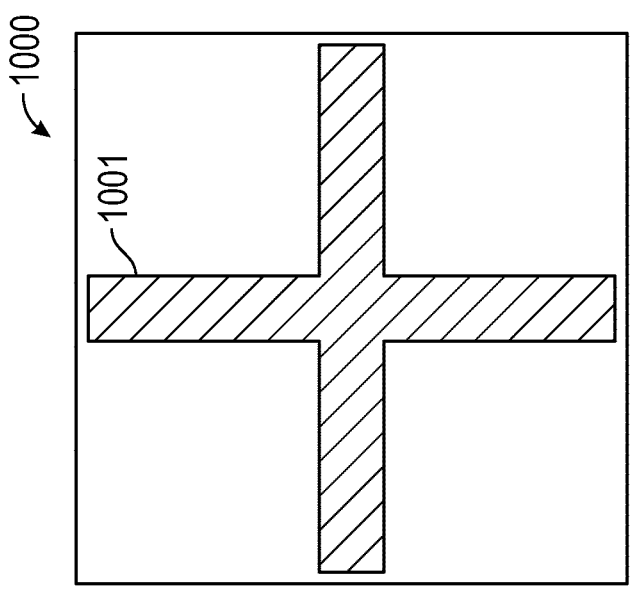

The present inventors have also recognized the desirability of selectively increasing a free layer thickness to locally increase the maximum magnetic field, such as shown in FIGS. 10A-10C. The free layer is the portion of GMR film thickness through which domain walls travel. The thicker the free layer, the smaller the resulting observed change in resistance, therefore it can be desirable to keep the free layer as thin as possible to achieve high change in resistance when domain walls travel through, but thin free layer means lower maximum field of operation Bmax. The techniques described below with respect to FIGS. 10A-10C can be performed on any of the structures shown in FIGS. 5A-5C, 6A-6C, and 7A-7C.

FIGS. 10A-10C depict an example of increasing a free layer thickness to locally increase the maximum magnetic field Bmax, in accordance with this disclosure. FIG. 10A depicts a patterned cross shape 1000 of a magnetic film layer 1001, which represents any of the patterned cross shapes formed using the techniques shown in FIGS. 5A-5C, 6A-6C, and 7A-7C.

FIG. 10B depicts a photoresist material layer 1002 applied over a selective portion of the patterned cross shape 1000 of the magnetic film layer 1001. Then, the portions of the magnetic film layer 1001 not formed under the photoresist material layer 1002 can be thinned by partially etching their thickness.

The magnetic film layer 1001 can be thinned elsewhere so that only the crossing area includes the thicker magnetic film layer 1001.

FIG. 10C depicts two different regions of free layer thickness. The first region 1004 is the region that that was covered by the photoresist material layer 1002 in FIG. 10B and not thinned and, as a result, the magnetic film layer 1001 in the first region has a thickness of T1. The second region 1006 includes the portions of the magnetic film layer 1001 not covered by the photoresist material layer 1002 and that were thinned via etching. The magnetic film layer 1001 in the second region 1006 has a thickness of T2, where T1>T2.

Figure 11:
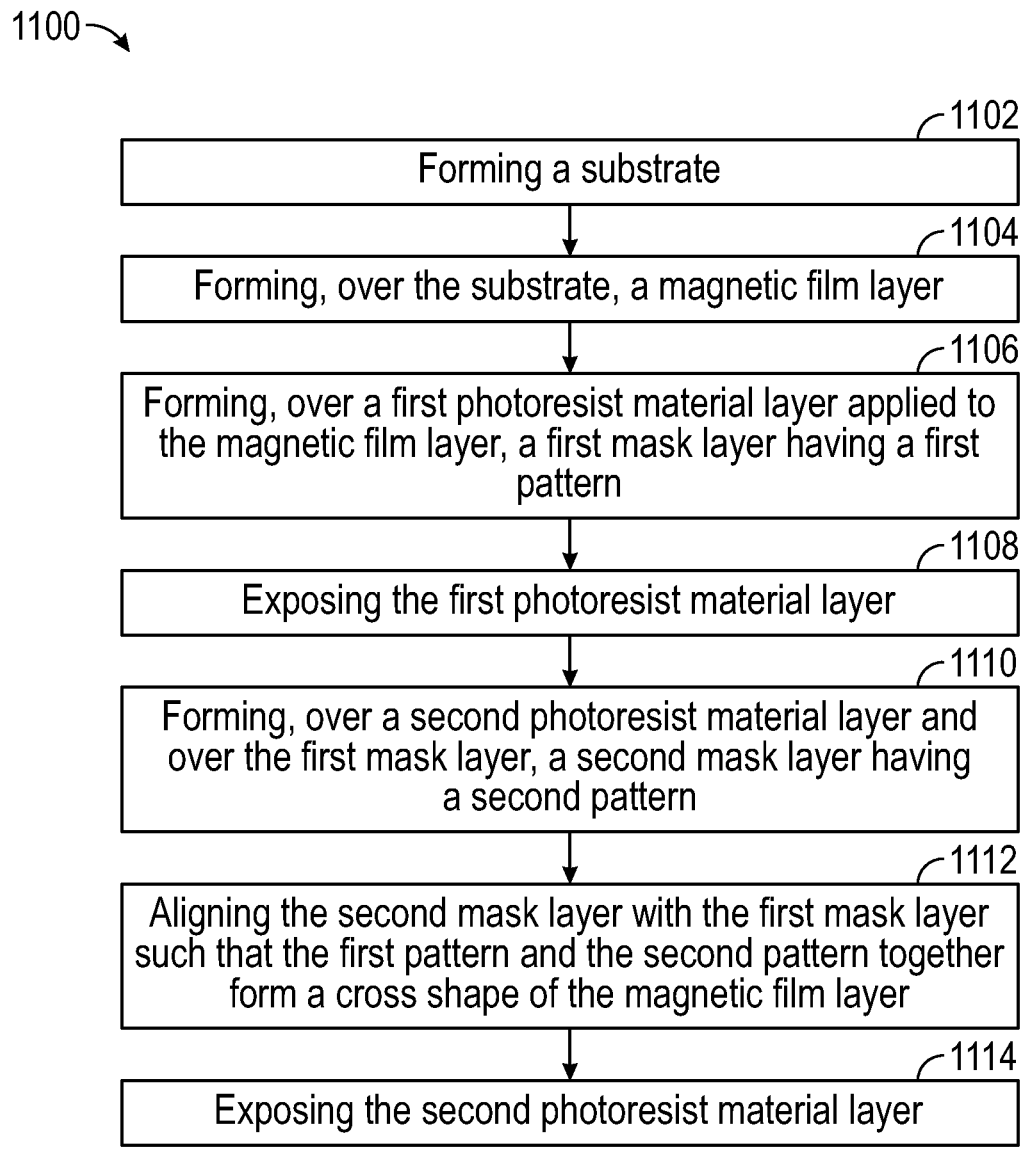
FIG. 11 depicts a flow diagram of an example of a method 1100 of manufacturing a closed-loop magnetic multi-turn sensor, in accordance with this disclosure.

FIG. 11 depicts a flow diagram of an example of a method 1100 of manufacturing a closed-loop magnetic multi-turn sensor, in accordance with this disclosure. At block 1102, the method 1100 includes forming a substrate. At block 1104, the method 1100 includes forming, over the substrate, a magnetic film layer. At block 1106, the method 1100 includes forming, over a first photoresist material layer applied to the magnetic film layer, a first mask layer having a first pattern. At block 1108, the method 1100 includes exposing the first photoresist material layer. At block 1110, the method 1100 includes forming, over a second photoresist material layer and over the first mask layer, a second mask layer having a second pattern. At block 1112, the method 1100 includes aligning the second mask layer with the first mask layer such that the first pattern and the second pattern together form a cross shape of the magnetic film layer. At block 1114, the method 1100 includes exposing the second photoresist material layer.

Figure 12:
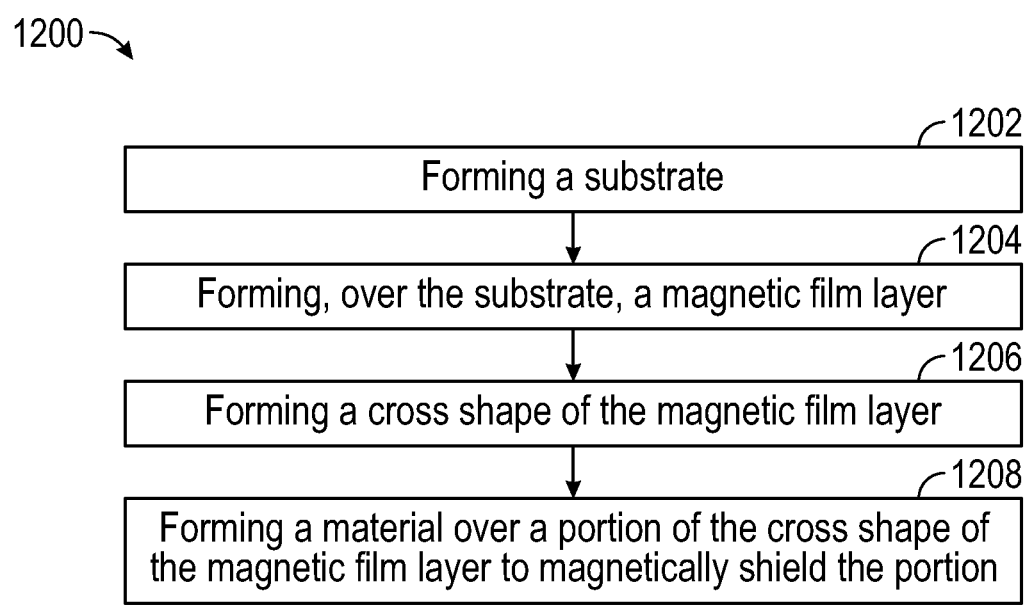
FIG. 12 depicts a flow diagram of an example of a method 1200 of manufacturing a closed-loop magnetic multi-turn sensor, in accordance with this disclosure.

FIG. 12 depicts a flow diagram of an example of a method 1200 of manufacturing a closed-loop magnetic multi-turn sensor, in accordance with this disclosure. For example, the method 1200 can be directed to the techniques shown in FIGS. 9A-9C. At block 1202, the method 1200 includes forming a substrate. At block 1204, the method 1200 includes forming, over the substrate, a magnetic film layer. At block 1206, the method 1200 includes forming a cross shape of the magnetic film layer, such as any of the cross shapes shown in FIGS. 5C, 6C, and 7C. At block 1208, the method 1200 includes forming a material over a portion of the cross shape of the magnetic film layer to magnetically shield the portion. For example, the shielding material 902 of FIG. 9B can be formed over the cross shape. In some examples, the shielding material can be patterned, such as shown in FIG. 9C.

VARIOUS NOTES

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following aspects, the terms "including" and "comprising" are open-ended, that is, a system, device, article, composition, formulation, or process that includes elements in addition to those listed after such a term in an aspect are still deemed to fall within the scope of that aspect. Moreover, in the following aspects, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the aspects. Also, in the above Detailed Description, various features may be grouped together to streamline the disclosure. This should not be interpreted as intending that an unclaimed disclosed feature is essential to any aspect. Rather, inventive subject matter may lie in less than all features of a particular disclosed embodiment. Thus, the following aspects are hereby incorporated into the Detailed Description as examples or embodiments, with each aspect standing on its own as a separate embodiment, and it is contemplated that such embodiments may be combined with each other in various combinations or permutations. The scope of the invention should be determined with reference to the appended aspects, along with the full scope of equivalents to which such aspects are entitled.

The claimed invention is:

1. A method of manufacturing a closed-loop magnetic multi-turn sensor, the method comprising:
   forming a substrate;
   forming, over the substrate, a magnetic film layer;
   forming, over a first photoresist material layer applied to the magnetic film layer, a first mask layer having a first pattern;
   exposing the first photoresist material layer;
   forming, over a second photoresist material layer and over the first mask layer, a second mask layer having a second pattern;

aligning the second mask layer with the first mask layer such that the first pattern and the second pattern together form a cross shape of the magnetic film layer; and exposing the second photoresist material layer.

2. The method of claim 1, wherein forming, over the first photoresist material layer, the first mask layer having the first pattern includes:
forming a first linear mask portion;
forming a second linear mask portion, wherein the second linear mask portion is perpendicular to the first linear mask portion; and
forming a third linear mask portion, wherein the third linear mask portion is perpendicular to the first linear mask portion, wherein the third linear mask portion is linearly aligned with the second linear mask portion, and wherein neither the second linear mask portion nor the third linear mask portion intersect with the first linear mask portion.

3. The method of claim 2, wherein the first photoresist material layer and the second photoresist material layer are the same photoresist material layer, and wherein forming, over the second photoresist material layer and over the first mask layer, the second mask layer having a second pattern includes:
forming a fourth linear mask portion, wherein when aligned with the first pattern:
the fourth linear mask portion couples the second linear mask portion to the third linear mask portion, and
the fourth linear mask portion intersects the first linear mask portion,
wherein neither the first pattern nor the second pattern alone forms a cross shape.

4. The method of claim 1, wherein forming, over the first photoresist material layer, the first mask layer having the first pattern includes:
forming a first linear mask portion;
forming a second linear mask portion, wherein the second linear mask portion is perpendicular to the first linear mask portion;
forming a third linear mask portion, wherein the third linear mask portion is perpendicular to the second linear mask portion, and wherein the third linear mask portion is linearly aligned with the first linear mask portion; and
forming a fourth linear mask portion, wherein the fourth linear mask portion is perpendicular to the third linear mask portion, and wherein the fourth linear mask portion is linearly aligned with the second linear mask portion,
wherein none of the first linear mask portion, the second linear mask portion, the third linear mask portion, and the fourth linear mask portion intersect with one another.

5. The method of claim 4, wherein the first photoresist material layer and the second photoresist material layer are the same photoresist material layer, and wherein forming, over the second photoresist material layer and over the first mask layer, the second mask layer having a second pattern includes:
forming a cross shape portion,
wherein when the second mask layer is aligned with the first mask layer, the cross shape portion connects the first linear mask portion to the third linear mask portion and the second linear mask portion to the fourth linear mask portion.

6. The method of claim 1, wherein forming, over the first photoresist material layer, the first mask layer having the first pattern includes:
forming a first triangular mask portion;
forming a second triangular mask portion, wherein the second triangular mask portion is offset from the first triangular mask portion;
forming a third triangular mask portion, wherein the third triangular mask portion is offset from the second triangular mask portion and the first triangular mask portion; and
forming a fourth triangular mask portion, wherein the fourth triangular mask portion is offset from the third triangular mask portion and the second triangular mask portion and the first triangular mask portion,
wherein spaces between the first triangular mask portion, the second triangular mask portion, the third triangular mask portion, and the fourth triangular mask portion define a first cross shape.

7. The method of claim 6, wherein the first photoresist material layer and the second photoresist material layer are different photoresist material layers, and wherein forming, over the second photoresist material layer and over the first mask layer, the second mask layer having a second pattern includes:
forming a second cross shape, wherein the second cross shape is different from the first cross shape,
wherein when the second mask layer is aligned with the first mask layer, the first cross shape modifies the second cross shape to form a third cross shape that is different from both the first cross shape and the second cross shape.

8. The method of claim 1, comprising:
implanting a dopant material in a portion of the cross shape of the magnetic film layer.

9. The method of claim 1, comprising:
forming a material over a portion of the cross shape of the magnetic film layer to magnetically shield the portion.

10. The method of claim 9, wherein forming the material over the portion of the cross shape of the magnetic film layer to magnetically shield the portion includes:
forming a patterned material over the portion of the cross shape of the magnetic film layer to magnetically shield the portion.

11. The method of claim 1, comprising:
forming a material layer over the substrate including the cross shape of the magnetic film layer;
applying a third photoresist material layer over a portion of the cross shape of the magnetic film layer; and
etching away the material layer not formed under the third photoresist material layer.

12. A closed-loop magnetic multi-turn sensor, the multi-turn sensor comprising:
a substrate;
a magnetic film layer formed over the substrate;
a first mask layer formed over the magnetic layer and forming a first pattern;
a second mask layer formed over the magnetic layer and forming a second pattern; and
a cross shape of the magnetic film layer formed by aligning the first pattern formed by the first mask layer and the second pattern formed by the second mask layer.

13. The closed-loop magnetic multi-turn sensor of claim 12, comprising:
a dopant material implanted in a portion of the cross shape of the magnetic film layer.

14. The closed-loop magnetic multi-turn sensor of claim 12, comprising:
   a shielding material formed over a portion of the cross shape of the magnetic film layer to magnetically shield the portion.

15. The closed-loop magnetic multi-turn sensor of claim 14, wherein the shielding material is patterned.

16. The closed-loop magnetic multi-turn sensor of claim 15, wherein the pattern defines holes.

17. The closed-loop magnetic multi-turn sensor of claim 12, wherein at least one of the first pattern and the second pattern does not include a cross shape.

18. A method of manufacturing a closed-loop magnetic multi-turn sensor, the method comprising:
   forming a substrate;
   forming, over the substrate, a magnetic film layer;
   forming a cross shape of the magnetic film layer by aligning a first pattern formed by a first mask layer and a second pattern formed by a second mask layer; and
   forming a material over a portion of the cross shape of the magnetic film layer to magnetically shield the portion.

19. The method of claim 18, wherein forming the material over the portion of the cross shape of the magnetic film layer to magnetically shield the portion includes:
   forming a patterned material over the portion of the cross shape of the magnetic film layer to magnetically shield the portion.

20. The method of claim 19, wherein the patterned material defines holes.

* * * * *